United States Patent
Lu et al.

(10) Patent No.: US 12,004,342 B2
(45) Date of Patent: Jun. 4, 2024

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Jingwen Lu, Hefei (CN); Hai-Han Hung, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 385 days.

(21) Appl. No.: 17/502,247

(22) Filed: Oct. 15, 2021

(65) Prior Publication Data
US 2022/0254786 A1    Aug. 11, 2022

Related U.S. Application Data

(63) Continuation of application No. PCT/CN2021/105313, filed on Jul. 8, 2021.

(30) Foreign Application Priority Data

Feb. 9, 2021 (CN) .......................... 202110181226.6

(51) Int. Cl.
H10B 12/00 (2023.01)
(52) U.S. Cl.
CPC .......... H10B 12/482 (2023.02); H10B 12/315 (2023.02)
(58) Field of Classification Search
CPC . H10B 12/482; H10B 12/315; H10B 12/0335
See application file for complete search history.

(56) References Cited

U.S. PATENT DOCUMENTS

| 8,247,030 B2 | 8/2012 | Suzuki et al. |
| 10,672,773 B2 | 6/2020 | Ji et al. |
| 10,978,458 B2 | 4/2021 | Ji et al. |

(Continued)

FOREIGN PATENT DOCUMENTS

| CN | 101965636 A | 2/2011 |
| CN | 107492550 A | 12/2017 |
| CN | 110364529 A | 10/2019 |

(Continued)

OTHER PUBLICATIONS

International Search Report cited in PCT/CN2021/105313 mailed Nov. 10, 2021, 10 pages.

*Primary Examiner* — Samuel A Gebremariam
(74) *Attorney, Agent, or Firm* — Cooper Legal Group, LLC

(57) ABSTRACT

Embodiments of the present disclosure provide a method for manufacturing a semiconductor structure and a semiconductor structure. The manufacturing method includes: providing a substrate, and forming bit lines extending in a first direction and trenches between the adjacent bit lines on the substrate; forming a dielectric layer and a contact layer filling the trenches, parts of the dielectric layer and parts of the contact layer being arranged at intervals in the first direction, both the dielectric layer and the contact layer being in contact with the substrate, and the contact layer having first gaps; removing part of the contact layer, to expose the first gaps; forming a filling layer to fill the first gaps; and etching the contact layer and the filling layer back.

19 Claims, 11 Drawing Sheets

(56) References Cited

U.S. PATENT DOCUMENTS

2004/0033659 A1     2/2004  Seitz et al.
2021/0035983 A1*    2/2021  Song .................... H10B 12/053

FOREIGN PATENT DOCUMENTS

CN      110957209 A    4/2020
CN      112242346 A    1/2021
CN      112992792 A    6/2021

* cited by examiner

METHOD FOR MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2021/105313, filed on Jul. 8, 2021, which claims the priority to Chinese Patent Application No. 202110181226.6, titled "METHOD FOR MANUFACTURING SEMICONDUCTOR STRUCTURE AND SEMICONDUCTOR STRUCTURE", filed on Feb. 9, 2021. The entire contents of International Application No. PCT/CN2021/105313 and Chinese Patent Application No. 202110181226.6 are incorporated herein by reference.

TECHNICAL FIELD

The present disclosure relates to, but is not limited to, a method for manufacturing a semiconductor structure and a semiconductor structure.

BACKGROUND

Memories in semiconductor structures are memory components used to store programs and various data information. Random access memories include static random access memories and dynamic random access memories. A dynamic random access memory usually includes a capacitor and a transistor connected to the capacitor. The capacitor is used to store charges representing stored information, and the transistor is a switch that controls the inflow and release of charges from the capacitor. When data is written, the word line provides a high level, the transistor is turned on, and the bit line charges the capacitor. When data is read, the word line also provides a high level, the transistor is turned on, and the capacitor is discharged, so that the bit line obtains a read signal.

The contact layer is a structure that realizes electrical connection between the capacitor and the substrate. The quality of the contact layer has a great impact on the yield of the semiconductor structure. However, the quality of the existing contact layer needs to be improved.

SUMMARY

The subject matter is described in detail herein below, which is not intended to limit the scope of protection of claims.

The first aspect of the present disclosure provides a method for manufacturing a semiconductor structure, including: providing a substrate, and forming bit lines extending in a first direction and trenches between the adjacent bit lines on the substrate; forming a dielectric layer and a contact layer filling the trenches, parts of the dielectric layer and parts of the contact layer being arranged at intervals in the first direction, both the dielectric layer and the contact layer being in contact with the substrate, and the contact layer having first gaps; removing part of the contact layer, to expose the first gaps; forming a filling layer to fill the first gaps; and etching the contact layer and the filling layer back.

The second aspect of the present disclosure provides a semiconductor structure, including: a substrate, the substrate having bit lines extending in a first direction; a dielectric layer and a contact layer located between the adjacent bit lines, parts of the dielectric layer and parts of the contact layer being arranged at intervals in the first direction, and both the dielectric layer and the contact layer being in contact with the substrate; and a filling layer located in the contact layer, and the contact layer exposing top surface of the first filling layer.

After the drawings and detailed description are read and understood, other aspects may be understood.

BRIEF DESCRIPTION OF THE DRAWINGS

The drawings, which are incorporated in and constitute a part of the specification, illustrate embodiments of the present disclosure and together with the description serve to explain the principles of the embodiments of the present disclosure. In these drawings, similar reference numerals are used for representing similar elements. The drawings in the following description are only some rather than all of the embodiments of the present disclosure. Those skilled in the art would be able to derive other drawings from these drawings without any creative efforts.

REFERENCE NUMERALS

Figure 1:
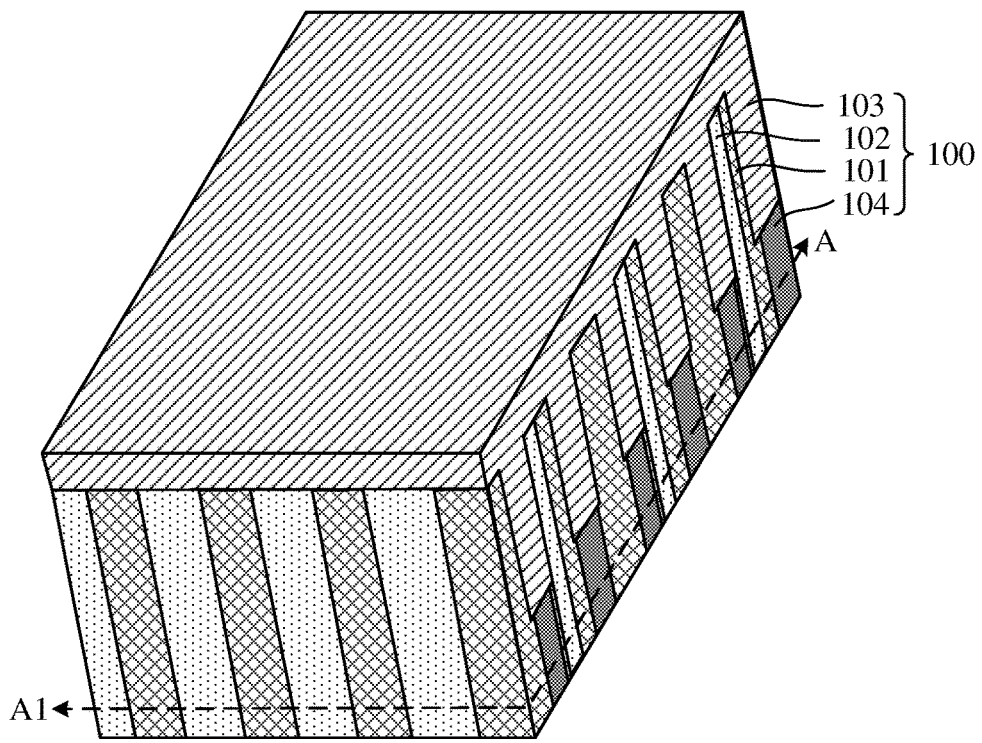
FIGS. 1-17 are structural schematic diagrams corresponding to various steps in a method for manufacturing a semiconductor structure provided in the first embodiment of the present disclosure.

100—substrate; 101—isolation structure; 102—active region; 103—first insulating layer; 104—buried word line; 105—bit line contact hole; 106—bit line contact layer; 107—bit line; 108—barrier layer; 109—bit line conductive layer; 110—second insulating layer; 111—protective layer; 111b—second position; 112—contact layer; 112a—initial contact layer; 112b—third position; 113—first gap; 114—first position; 115—spacer groove; 116—first sub-dielectric layer; 117—second sub-dielectric layer; 118—dielectric layer; 119—second gap; 120—filling layer; 121—conductive layer; 122—trench;

200—substrate; 201—isolation structure; 202—barrier layer; 203—bit line conductive layer; 204—second insulating layer; 205—isolation layer; 206—protective layer; 207—bit line; 208—dielectric layer; 209—through hole; 210—contact layer; 211—first gap; 212—filling layer; 213—conductive layer; 214—trench; 220—active region.

DETAILED DESCRIPTION

In order to make the objectives, technical solutions and advantages of the present disclosure clearer, the following clearly and completely describes the technical solutions in the embodiments of the present disclosure with reference to the accompanying drawings in the embodiments of the present disclosure. Apparently, the described embodiments are only part of the embodiments of the present disclosure, not all of them. All other embodiments obtained by those skilled in the art based on the embodiments of the present disclosure without any creative efforts shall fall within the protection scope of the present disclosure. It should be noted that the embodiments in the present disclosure and the features in the embodiments can be combined with each other on a non-conflict basis.

It can be seen from the background art that the quality of the existing contact layer needs to be improved. The analysis found that the main reason is: as the size of the semiconductor structure continues to reduce, the depth-width ratio of the trenches used to fill the contact layer is increasingly large, resulting in the formation of a gap in the contact layer during filling; in the subsequent process of etching the contact layer back, the etching gas will enter the gap to increase the volume of the gap; the too large gap will not only increase the resistance of the contact layer, but also cause the risk of conductive breakdown, thereby reducing the yield of the semiconductor structure.

An embodiment of the present disclosure provides a method for manufacturing a semiconductor structure, including: after forming a contact layer, removing part of the contact layer to expose first gaps in the contact layer, so as to form a filling layer for filling the first gaps. Since the first gaps are filled, the etching gas will not enter the first gaps in the subsequent process of etching the contact layer and the filling layer back, which can avoid expansion of the first gaps to cause voids in the contact layer, thereby avoiding increasing the resistance of the contact layer and reducing the risk of conductive breakdown.

The first embodiment of the present disclosure provides a method for manufacturing a semiconductor structure. FIGS. 1 to 17 are structural schematic diagrams corresponding to various steps in the method for manufacturing a semiconductor structure provided in the first embodiment of the present disclosure, which will be described in detail below with reference to the drawings.

Referring to FIGS. 1 to 5, a substrate 100 is provided, and bit lines 107 extending in a first direction and trenches 122 between adjacent bit lines 107 are formed on the substrate 100.

Figure 2:
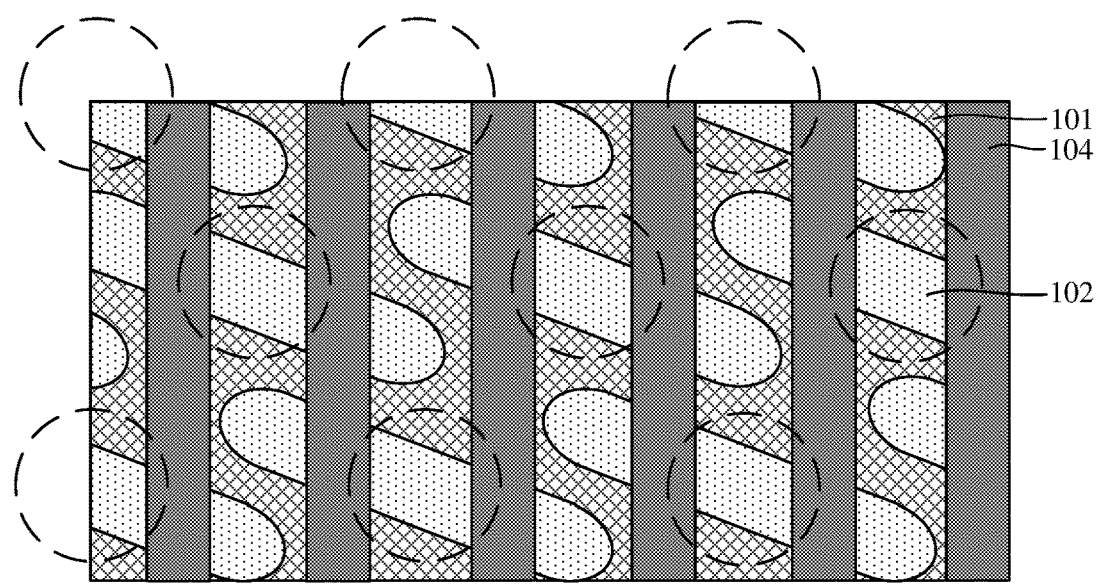

The structure of the substrate 100 will be described in detail below. Referring to FIGS. 1 and 2, FIG. 1 is a three-dimensional structure diagram of the substrate 100, and FIG. 2 is a cross-sectional view of FIG. 1 in the A-A1 direction. The substrate 100 includes a plurality of discrete active regions 102, the active regions 102 may be active structures of sources or drains, the material of the active regions 102 includes polysilicon, and the polysilicon includes doped ions such as boron and phosphorus.

The substrate 100 further includes an isolation structure 101 for isolating adjacent active regions 102. In this embodiment, the top surface of the isolation structure 101 is flush with the top surfaces of the active regions 102. The material of the isolation structure 101 is an insulating material, such as silicon dioxide, silicon carbide, or silicon nitride.

The substrate 100 further includes a plurality of discrete buried word lines 104. The buried word lines 104 are embedded in the active regions 102 and the isolation structure 101, and their upper surfaces are exposed by the active regions 102 and the isolation structure 101. A gate dielectric layer is further formed between the buried word lines 104 and the active regions 102. The material of the buried word lines 104 is a metal material with relatively high conductivity, such as copper, aluminum, tungsten, tantalum, molybdenum, silver, or gold.

The substrate 100 further includes a first insulating layer 103 on the buried word lines 104, and the first insulating layer 103 is used to prevent the buried word lines 104 from being oxidized. The first insulating layer 103 also covers the top surfaces of the active regions 102 and the isolation structure 101. The material of the first insulating layer 103 is an insulating material, such as silicon nitride, silicon dioxide, or silicon carbide.

Hereinafter, the steps of forming bit lines 107 and trenches 122 will be specifically described.

Figure 3:
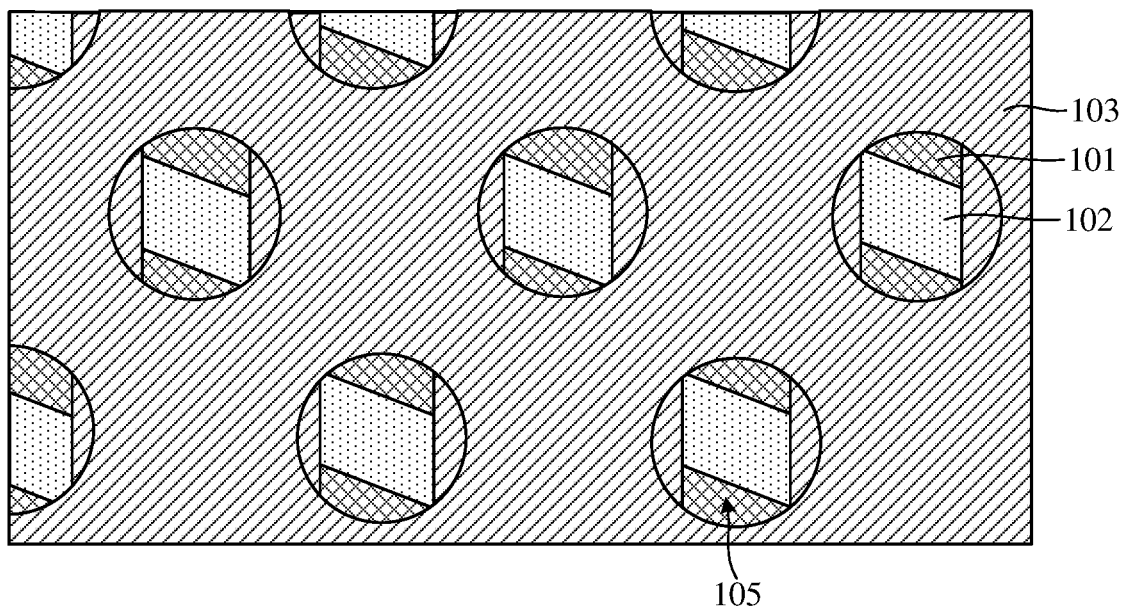

Referring to FIG. 3, the substrate 100 is etched to form bit line contact holes 105, the bit line contact holes 105 exposing the top surfaces of the active regions 102. The bit line contact holes 105 are filling intervals of the bit line contact layer formed later. Referring to FIG. 2, the dotted circle in FIG. 2 indicates the relative positions of the bit line contact holes 105 and the active regions 102, that is, the bit line contact holes 105 are opposite to the central positions of the active regions 102.

The forming the bit line contact holes 105 includes: forming a mask on the first insulating layer 103; patterning the first insulating layer 103 by dry etching to remove the first insulating layer 103 higher than the top surfaces of the active regions 102, thus forming cylindrical through holes; continuing the dry etching on the active regions 102 exposed by the through holes such that the top surfaces of the active regions 102 are lower than the top surface of the isolation structure 101, thus forming the bit line contact holes 105. In other embodiments, the bit line contact holes may also be formed by wet etching.

Figure 4:
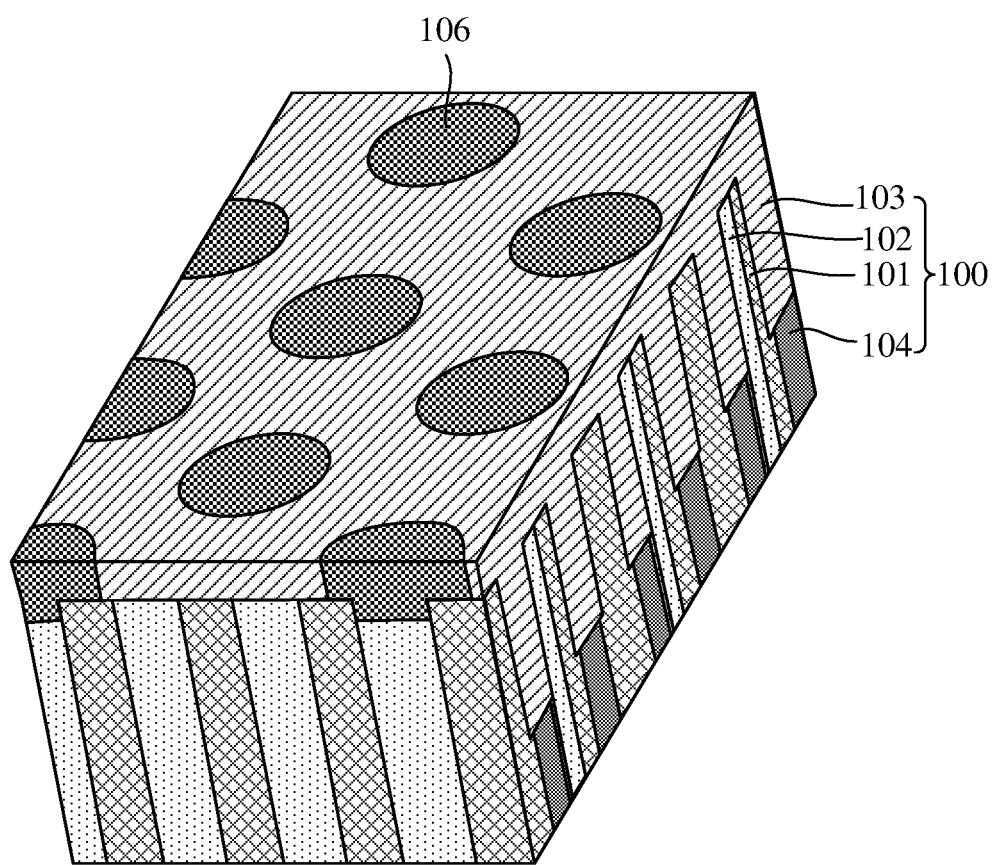

Referring to FIG. 4, a bit line contact layer 106 filling the bit line contact holes 105 (refer to FIG. 3) is formed. Part of the thickness of the bit line contact layer 106 is embedded between parts of the isolation structure 101. As such, the bit line contact layer 106 has a larger contact area with the substrate 100, the adhesion between the two is greater, and the semiconductor structure has better firmness.

The material of the bit line contact layer 106 is a conductive material, such as polysilicon, titanium or tungsten.

Figure 5:
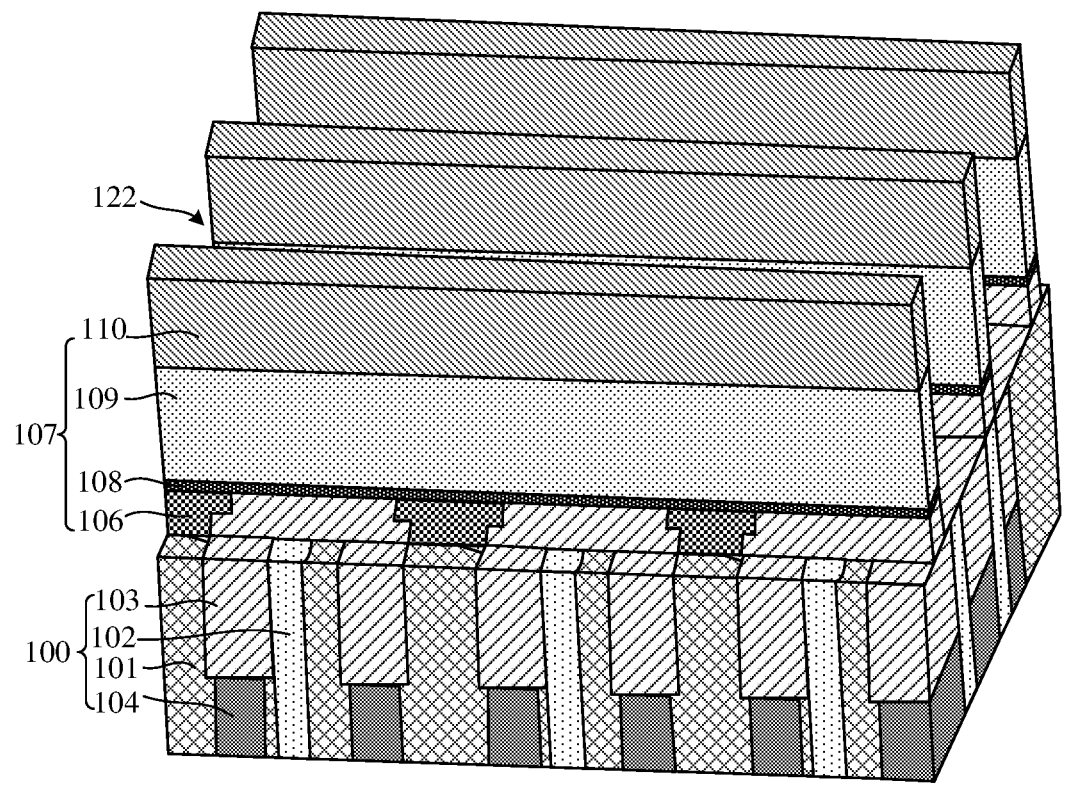

Referring to FIG. 5, trenches 122 as well as a barrier layer 108, a bit line conductive layer 109 and a second insulating layer 110 that are stacked are formed on the substrate 100.

An initial barrier layer, an initial bit line conductive layer, and an initial insulating layer that are stacked are formed on the substrate 100. In this embodiment, the initial barrier layer, the initial bit line conductive layer, and the initial insulating layer are formed by chemical vapor deposition.

A mask is formed on the initial second insulating layer, and dry etching is performed on the initial barrier layer, the initial bit line conductive layer, and the initial second insulating layer to remove part of the initial barrier layer, the initial bit line conductive layer, and the initial second insulating layer, thus forming the trenches 122 as well as the barrier layer 108, the bit line conductive layer 109 and the second insulating layer 110 that are stacked. In this embodiment, part of the bit line contact layer 106 and the first insulating layer 103 are also etched.

The center lines of the barrier layer 108 and the bit line conductive layer 109 coincide with the center of the bit line contact layer 106, which can increase the contact area between the barrier layer 108 and bit line conductive layer 109 and the bit line contact layer 106, thereby reducing the contact resistance and improving the operating rate of the semiconductor structure.

The material of the barrier layer 108 may be titanium nitride or tantalum nitride. The material of the bit line conductive layer 109 may be tungsten, tantalum, molybdenum, or gold. The material of the second insulating layer 110 may be silicon nitride, silicon dioxide, or silicon carbide.

The barrier layer 108, the bit line conductive layer 109, the second insulating layer 110, and the bit line contact layer 106 are used to constitute the bit lines 107, and the spacing between adjacent bit lines 107 is equal.

The trenches 122 and the bit lines 107 extend in the first direction. In this embodiment, the first direction is perpendicular to the extending direction of the word line. In other embodiments, the angle between the first direction and the extending direction of the word line may be less than 90° and greater than or equal to 75°.

Figure 6:
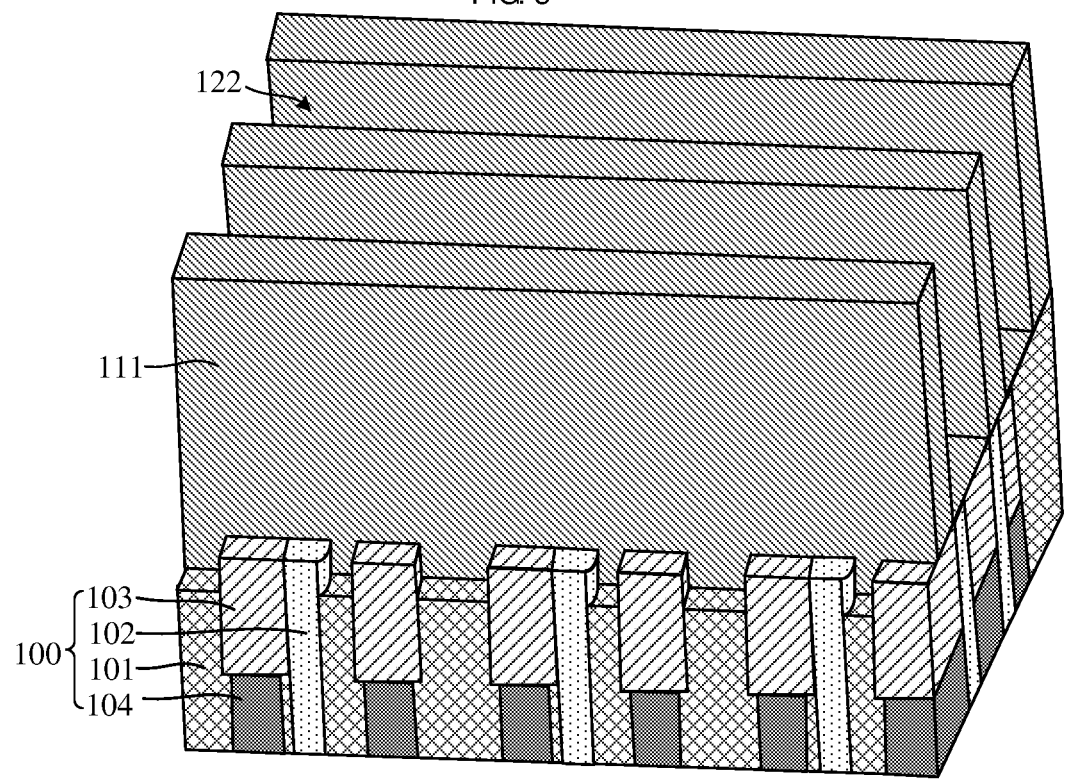

Referring to FIG. 6, a protective layer 111 is formed on the side walls and tops of the bit lines 107. The protective layer 111 is used to protect the bit lines 107 from being oxidized. The material of the protective layer 111 is an insulating material. In this embodiment, the material of the protective layer 111 is the same as that of the second insulating layer 110, such as silicon nitride, silicon dioxide, or silicon carbide.

In this embodiment, the protective layer 111 is also located on the surface of the substrate 100. Part of the protective layer 111 on the substrate 100 is removed to expose the active regions 102. In this embodiment, part of the isolation structure 101 is also removed, so that the top surface of the isolation structure 101 is lower than that of the active regions 102 and the side walls of the active regions 102 are exposed. As such, the contact area between the contact layer formed later and the active regions 102 can be increased, thereby reducing the contact resistance.

Referring to FIGS. 7-11, a dielectric layer 118 and a contact layer 112 that fill the trenches 122 (refer to FIG. 6) are formed, parts of the dielectric layer 118 and parts of the contact layer 112 being arranged at intervals in the first direction, both the dielectric layer 118 and the contact layer 112 being in contact with the substrate 100, and the contact layer 112 having first gaps 113.

In this embodiment, the contact layer 112 is a capacitor contact layer for electrically connecting a capacitor and the active regions 102. The material of the contact layer 112 may be polysilicon.

The dielectric layer 118 is used to isolate adjacent parts of the contact layer 112. In this embodiment, the dielectric layer 118 is of a double-layer structure, and includes a first sub-dielectric layer 116 and a second sub-dielectric layer 117. The material of the first sub-dielectric layer 116 is different from that of the second sub-dielectric layer 117.

The material of the first sub-dielectric layer 116 is an insulating material, and has a relatively high hardness, such as silicon nitride or silicon carbide.

The material of the second sub-dielectric layer 117 is an insulating material, has a dielectric constant lower than that of the material of the first sub-dielectric layer 116, and may be, for example, silicon dioxide. The lower dielectric constant can reduce the parasitic capacitance between the adjacent parts of the contact layer 112, thereby increasing the operating speed of the semiconductor structure. In other embodiments, the dielectric constant of the first sub-dielectric layer may also be less than that of the second sub-dielectric layer.

In other embodiments, the dielectric layer may also be of a single-layer structure.

It is worth noting that, in this embodiment, the contact layer 112 is formed earlier than the dielectric layer 118, that is, an initial contact layer filling the trenches 122 is first formed, the initial contact layer is patterned, and then the dielectric layer 118 is formed. In other embodiments, the dielectric layer and the through holes between adjacent parts of the dielectric layer may be first formed, and then the contact layer filling the through holes may be formed. Compared with the method of filling the through holes, the first gaps in the contact layer 112 that are formed by filling the trenches 122 are smaller. As such, the volume of the filling layer formed later in the first gaps is also smaller, which can reduce the influence on the electrical performance of the contact layer.

The method for forming the dielectric layer 118 and the contact layer 112 will be specifically described below.

Figure 7:
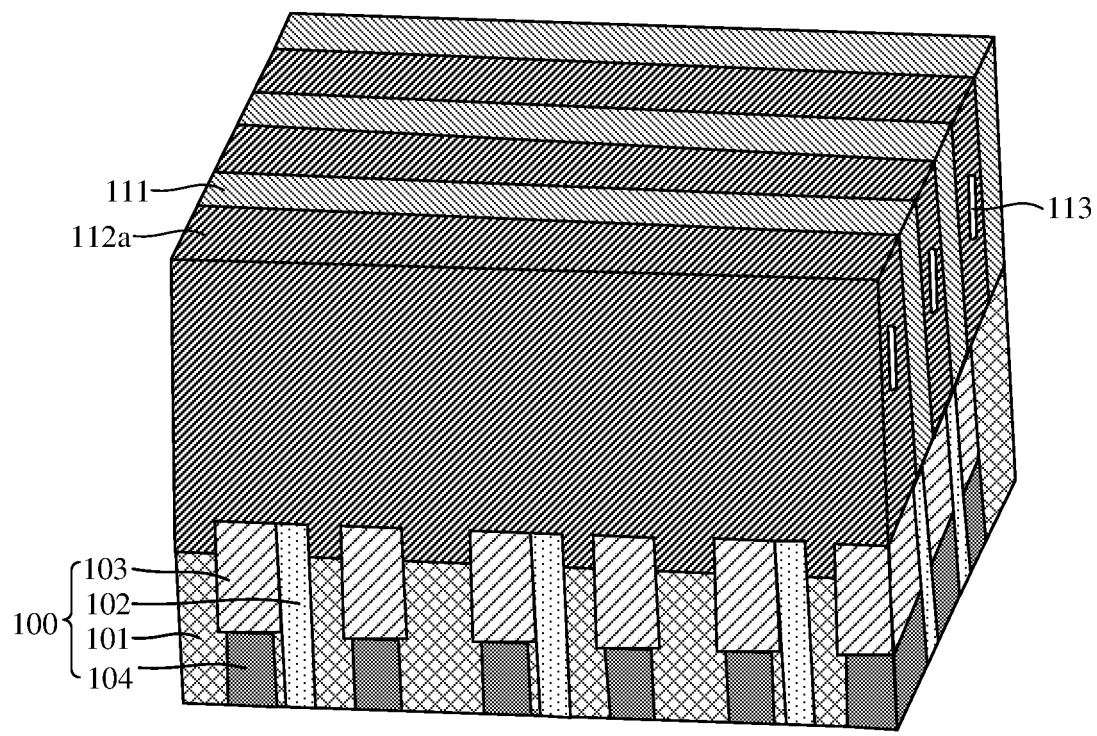
Figure 8:
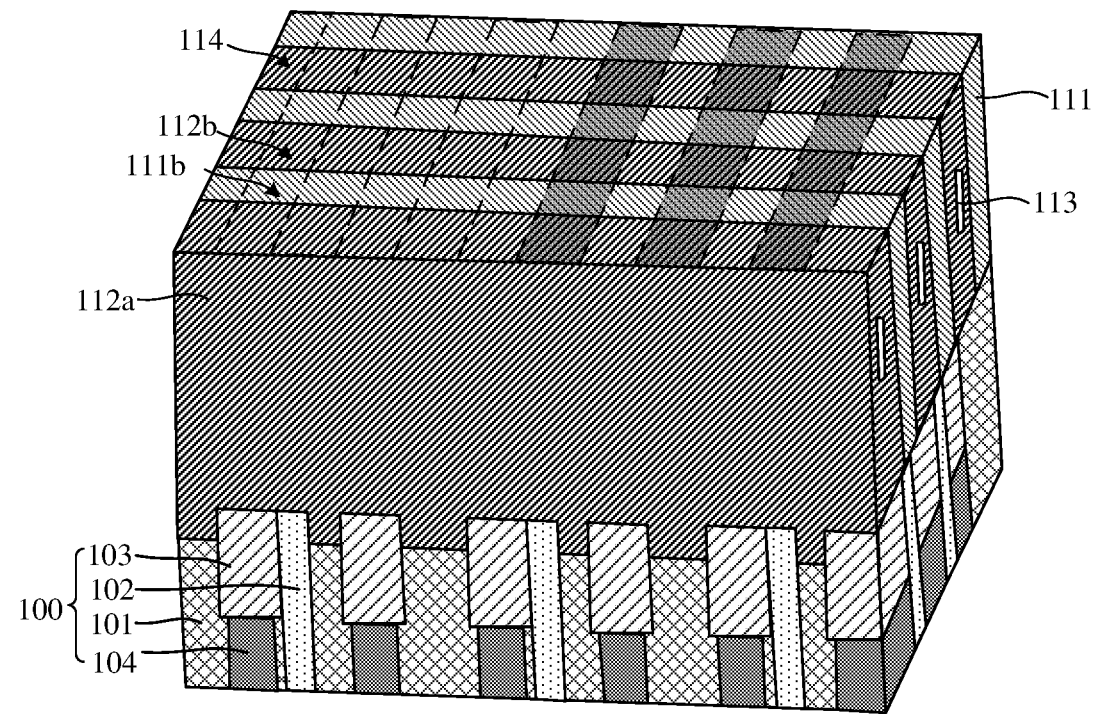
Figure 9:
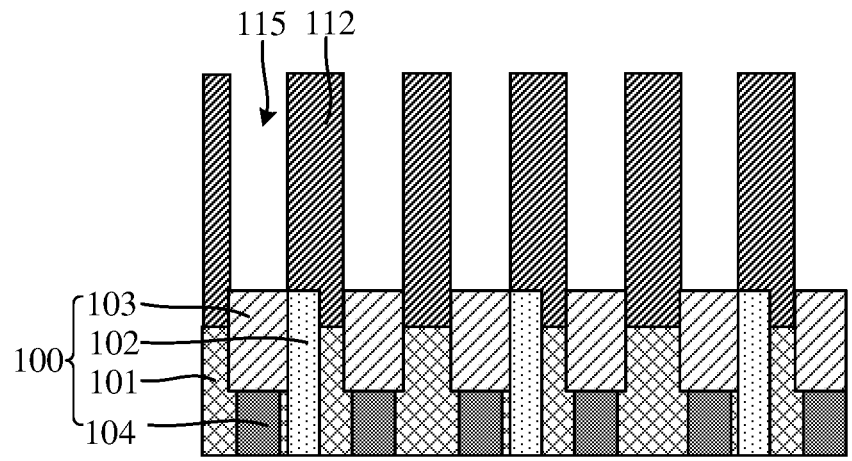

Referring to FIGS. 7-9, discrete parts of the contact layer 112 located in the trenches 122 (refer to FIG. 6) are formed.

Referring to FIG. 7, an initial contact layer 112a filling the trenches 122 (refer to FIG. 6) is formed. Since the trenches 122 have a relatively large depth-width ratio, the first gaps 113 will be produced during the process of depositing the material of the initial contact layer 112a.

In this embodiment, the initial contact layer 112a is formed by low-pressure chemical vapor deposition. The low-pressure vapor deposition has better step coverage and can reduce the volume of the first gaps 113, thereby reducing the influence on the electrical performance of the initial contact layer 112a.

The reaction gas for the low-pressure chemical vapor deposition may be $H_3SiN(C_3H_7)_2$, $Si_2H_6$ or $SiH[N(CH_3)_2]_3$.

The temperature of the low-pressure chemical vapor deposition is 380° C. to 500° C. The temperature within the above range can increase the activity of the reaction gas, thereby accelerating the reaction rate and further increasing the formation rate of the initial contact layer 112a.

The pressure of the low-pressure chemical vapor deposition is 1 Torr to 3 Torr. The pressure within the above range can increase the gas diffusion coefficient, thereby increasing the mass transfer rate of gaseous reactants and by-products and further increasing the formation rate of the initial contact layer 112a.

In other embodiments, the initial contact layer may also be formed by atmospheric pressure chemical vapor deposition.

Referring to FIGS. 8 and 9, the initial contact layer 112a is patterned to form discrete parts of the contact layer 112 and spacer grooves 115 between adjacent parts of the contact layer 112 in the trenches 122 (refer to FIG. 6).

Further referring to FIG. 8, a mask layer (not shown) extending in a second direction is formed on the initial contact layer 112a. In this embodiment, the mask layer is also located on the protective layer 111.

The second direction is different from the first direction. In this embodiment, the second direction is perpendicular to the first direction. In other embodiments, the angle between the second direction and the first direction is less than 90° and greater than or equal to 75°.

In this embodiment, the mask layer is located at first positions 114 (that is, the shadow regions in the figure). Second positions 111b and third positions 112b are arranged at intervals between adjacent first positions 114. The second positions 111b correspond to the protective layer 111 exposed by the mask layer, and the third positions 112b correspond to the initial contact layer 112a exposed by the mask layer. In the subsequent dry etching, the initial contact layer 112a at the third positions 112b will be removed to form spacer grooves; the protective layer 111 at the second positions 111b will be retained, but its height is slightly reduced.

Refer to FIG. 9, which is a partial cross-sectional view of the semiconductor structure in the first direction. Using the mask layer as a mask, dry etching is performed on the initial contact layer 112a (refer to FIG. 8) to form spacer grooves 115 until the bottoms of the spacer grooves 115 expose the substrate 100. The remaining part of the initial contact layer 112a serves as the contact layer 112.

During the process of etching the initial contact layer 112a, the initial contact layer 112a and the protective layer 111 have a relatively large etching selection ratio. Therefore, the protective layer 111 that is not blocked by the mask layer will not be removed, but its height is slightly reduced.

Figure 10:
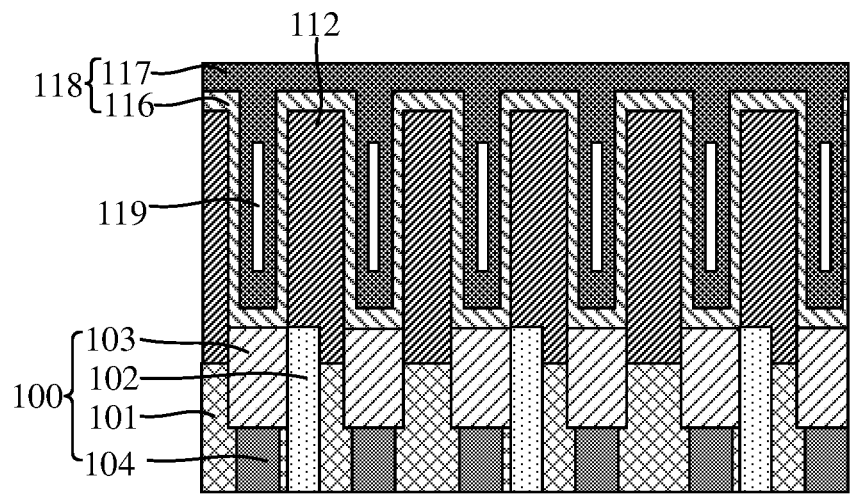
Figure 11:
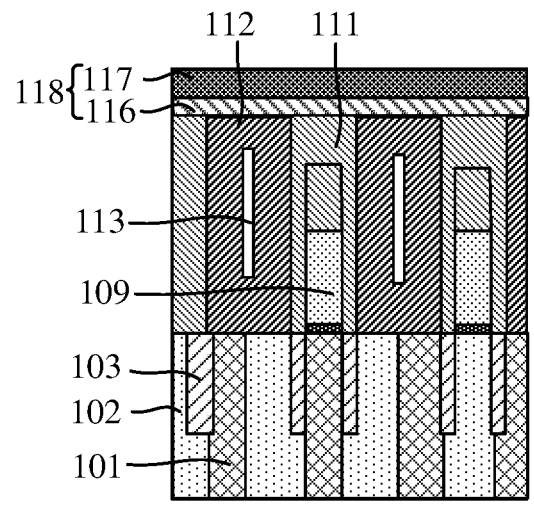

Referring to FIGS. 10 and 11, FIG. 10 is a partial cross-sectional view of the semiconductor structure in the first direction, and FIG. 11 is a partial cross-sectional view of the semiconductor structure in the second direction. The forming the dielectric layer 118 includes: forming the dielectric layer 118 to fill the spacer grooves 115 (refer to FIG. 9), the dielectric layer 118 having second gaps 119.

The forming the dielectric layer 118 includes: forming a first sub-dielectric layer 116, the first sub-dielectric layer 116 covering the bottoms and side walls of the spacer grooves 115, wherein in this embodiment, the first sub-dielectric layer 116 also covers the top surface of the contact layer 112 and the protective layer 111; and forming a second sub-dielectric layer 117, the second sub-dielectric layer 117 being located on the surface of the first sub-dielectric layer 116 and filling the spacer grooves 115, wherein in this embodiment, the second sub-dielectric layer 117 is also located on the top surface of the contact layer 112 and the protective layer 111, and the second sub-dielectric layer 117 has second gaps 119.

In this embodiment, the first sub-dielectric layer 116 and the second sub-dielectric layer 117 are formed by atomic layer deposition. The atomic layer deposition can improve the uniformity of the thicknesses of the first sub-dielectric layer 116 and the second sub-dielectric layer 117. In other embodiments, chemical vapor deposition may also be used.

In the first direction, the ratio of the thickness of the first sub-dielectric layer 116 to the width of the spacer grooves 115 is 1:4 to 1:3. Since the second sub-dielectric layer 117 occupies the remaining space of the spacer grooves 115, when the width of the first sub-dielectric layer 116 is within the above range, the ratio of the thickness of the second sub-dielectric layer 117 to the thickness of the first sub-dielectric layer 116 is 3:1 to 2:1. Since the first sub-dielectric layer 116 has a relatively high hardness, the second sub-dielectric layer 117 has a relatively low dielectric constant. Therefore, when the thicknesses of the two are within the above range, the dielectric layer 118 may have a relatively low dielectric constant and a relatively high hardness, which can reduce the parasitic capacitance between the parts of the contact layer 112 and improve the firmness of the semiconductor structure.

Figure 12:
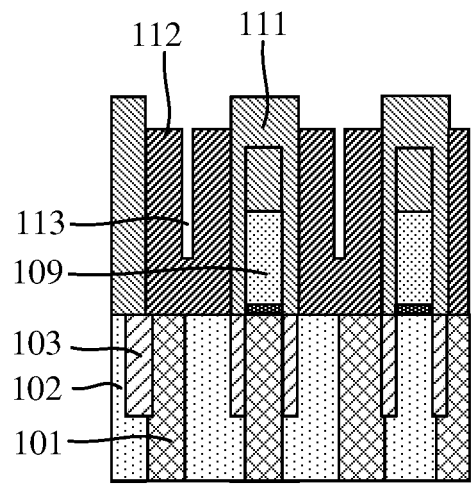

Refer to FIG. 12, which is a partial cross-sectional view of the semiconductor structure in the second direction. Part of the contact layer 112 is removed to expose the first gaps 113. In this embodiment, before part of the contact layer 112 is removed, the first sub-dielectric layer 116 and the second sub-dielectric layer 117 on the top surface of the contact layer 112 are also removed. In this embodiment, part of the contact layer 112, part of the first sub-dielectric layer 116 and part of the second sub-dielectric layer 117 are removed by dry etching. In other embodiments, wet etching may also be used.

Figure 13:
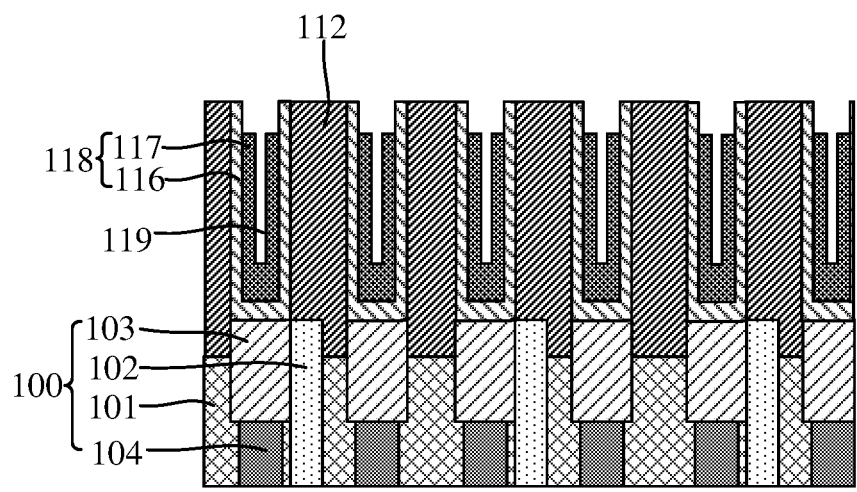

Referring to FIG. 13, while part of the contact layer 112 is removed to expose the first gaps 113, part of the dielectric layer 118 is removed to expose the second gaps 119.

The first sub-dielectric layer 116 and the second sub-dielectric layer 117 higher than the top surface of the contact layer 112 are first removed, and then the second sub-dielectric layer 117 higher than the second gaps 119 is removed.

It can be understood that the first gaps 113 and the second gaps 119 are exposed in the same process step, so the production process can be simplified and the process time can be shortened. In other embodiments, the exposing may also be carried out in two steps, that is, the first gaps are exposed first or the second gaps are exposed first.

Figure 14:
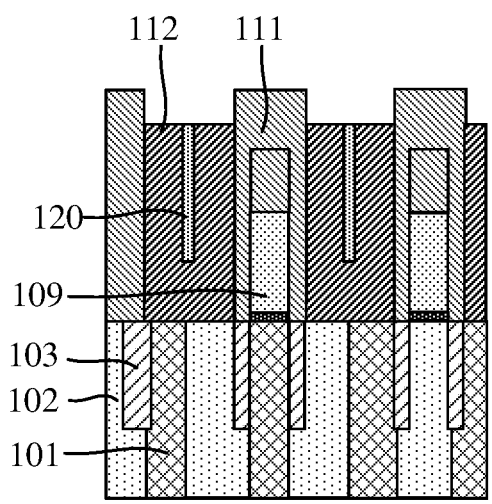

Referring to FIG. 14, a filling layer 120 is formed to fill the first gaps 113 (refer to FIG. 12). An initial filling layer is first formed by deposition, the initial filling layer filling the first gaps 113 and being also located on the top surface of the contact layer 112. The initial filling layer is etched back to remove the initial filling layer on the top surface of the contact layer 112, so as to form the filling layer 120 in the first gaps 113.

The filling layer 120 has a relatively large density, which can increase the filling rate of the first gaps 113 and reduce the probability of conductive breakdown. The material of the filling layer 120 may be silicon nitride.

In this embodiment, the filling layer 120 is formed by atomic layer deposition. The atomic layer deposition can further improve the density of the filling layer 120.

Figure 15:
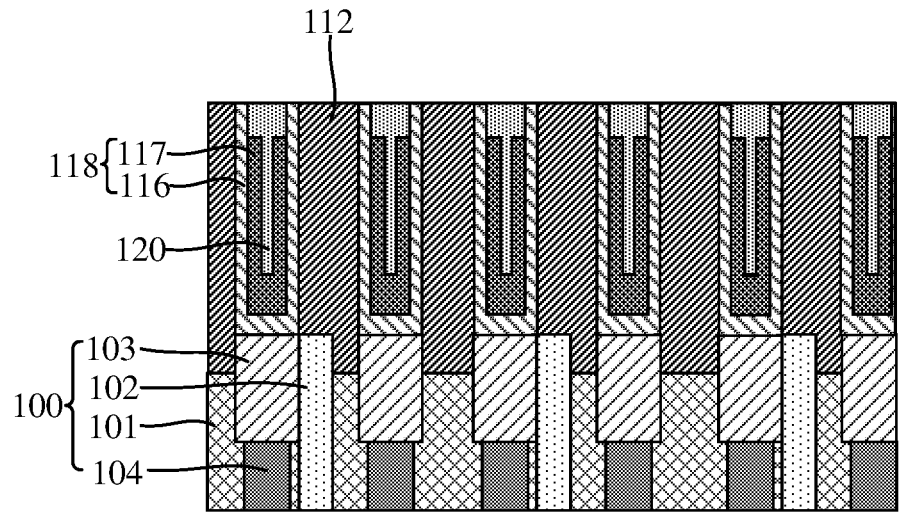

Referring to FIG. 15, while the filling layer 120 is formed to fill the first gaps 113 (refer to FIG. 13), the filling layer 120 also fills the second gaps 119 (refer to FIG. 13). In this embodiment, the filling layer 120 is also located on the top surface of the second sub-dielectric layer 117 and is flush with the top surface of the first sub-dielectric layer 116.

It can be understood that the first gaps 113 and the second gaps 119 are filled in the same process step, so the production process can be simplified and the process time can be shortened. In other embodiments, the filling may also be carried out in two steps, the first gaps are filled first or the second gaps are filled first.

Figure 16:
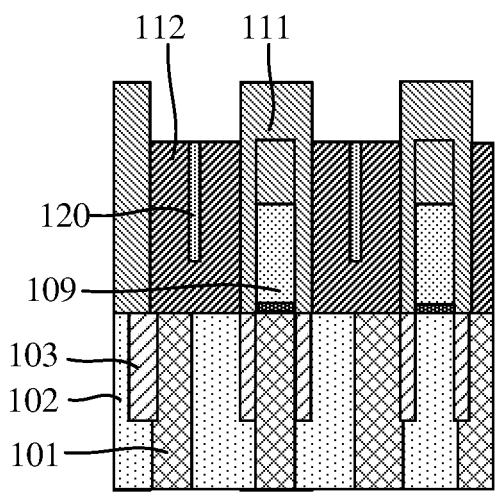

Referring to FIG. 16, the contact layer 112 and the filling layer 120 are etched back to reduce the heights of the contact layer 112 and the filling layer 120. In one embodiment, the top surfaces of the contact layer 112 and the filling layer 120 are flush with the top surface of the bit line conductive layer 109 by back etching. In another embodiment, the top surfaces of the contact layer 112 and the filling layer 120 are at positions of ⅓ to ⅔ of the height of the bit lines 107. In this embodiment, the contact layer 112 and the filling layer 120 are etched by dry etching. It is understandable that, since the first gaps 113 and the second gaps 119 are filled with the filling layer 120, the etching gas cannot enter the first gaps 113 and the second gaps 119 to expand the first gaps 113 and the second gaps 119. Therefore, the semiconductor structure has good electrical performance without the risk of electrical breakdown.

Figure 17:
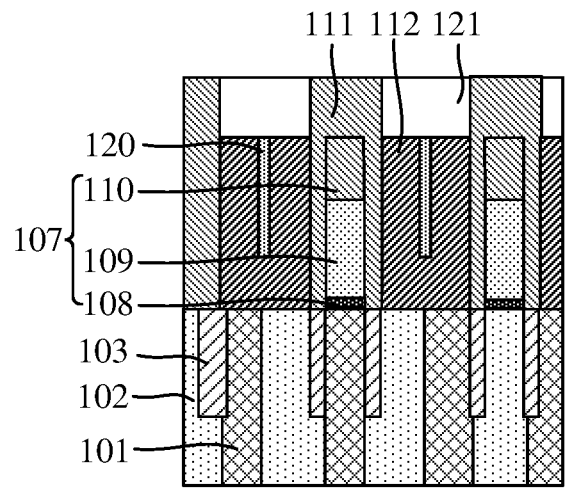

Referring to FIG. 17, a conductive layer 121 is formed on the remaining part of the contact layer 112 and the remaining part of the the filling layer 120. In this embodiment, the conductive layer 121 is formed by physical vapor deposition. The conductive layer 121 is used to electrically connect the capacitor formed later, so the material of the conductive layer 121 has relatively low resistance, for example, it may be a metal such as copper, aluminum, or tungsten.

Based on the above, this embodiment can reduce the first gaps 113 by filling the trenches 122, and expansion of the first gaps 113 and the second gaps 119 in the subsequent etching process to produce voids can be avoided by filling the first gaps 113 and the second gaps 119, thereby improving the electrical performance of the semiconductor structure and reducing the risk of conductive breakdown.

The second embodiment of the present disclosure provides a method for manufacturing a semiconductor structure. This embodiment is roughly the same as the first embodiment. The main differences include: in this embodiment, discrete parts of the dielectric layer and through holes between adjacent parts of the dielectric layer are first formed in trenches, and the through holes are filled to form a contact layer. FIGS. 18-24 are structural schematic diagrams corresponding to various steps of the manufacturing method provided in this embodiment, which will be described in detail below with reference to the accompanying drawings.

Figure 18:
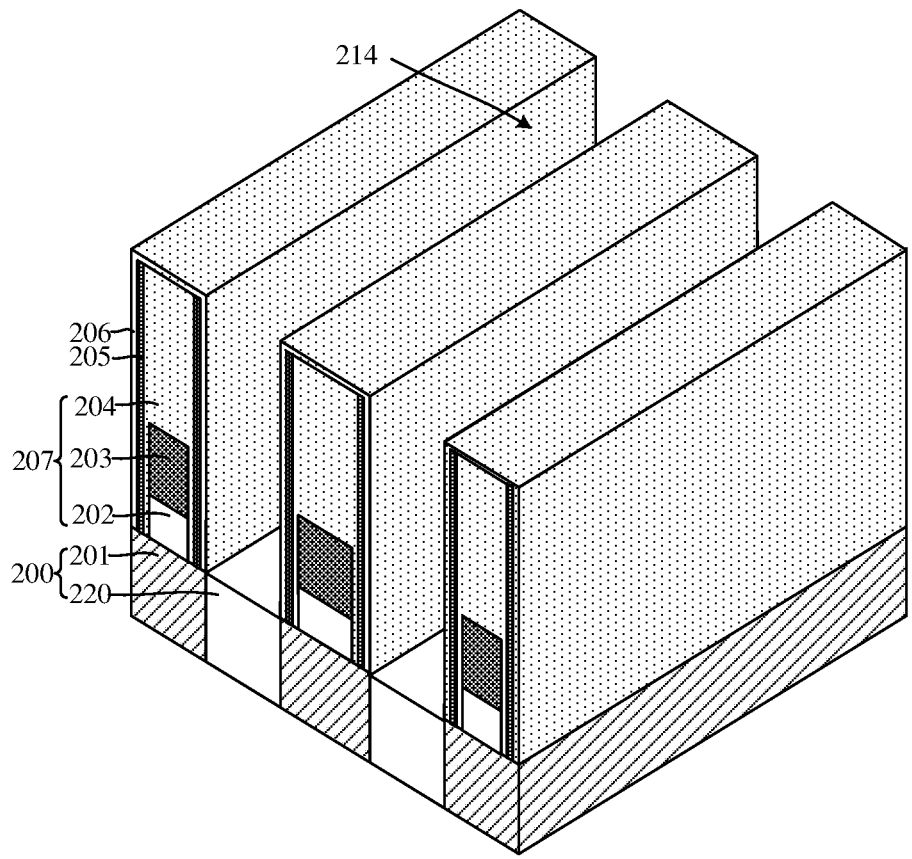
FIGS. 18-24 are structural schematic diagrams corresponding to various steps in a method for manufacturing a semiconductor structure provided in the second embodiment of the present disclosure.

Referring to FIG. 18, a substrate 200 is provided, and bit lines 207 extending in a first direction and trenches 214 between adjacent bit lines 207 are formed on the substrate 200.

The substrate 200 includes active regions 220 and an isolation structure 201 for isolating adjacent active regions 220. The substrate 200 may further include buried word lines, a gate dielectric layer and a first insulating layer. Detailed description of the substrate 200 refers to the first embodiment, and details are not described herein again.

The bit lines 207 include a bit line contact layer, a barrier layer 202, a bit line conductive layer 203 and a second insulating layer 204 that are stacked. In this embodiment, the second insulating layer 204 is also located on side walls of the barrier layer 202 and the bit line conductive layer 203. The side walls of the bit lines 207 also have an isolation layer 205 and a protective layer 206, and the protective layer 206 is also located on the top surfaces of the bit lines 207.

Specific steps of forming the bit lines 207 refer to the first embodiment, and details are not described herein again.

The trenches 214 are located between the adjacent bit lines 207 and are subsequently used to fill a contact layer and a dielectric layer.

The steps of forming a filling layer and a dielectric layer will be specifically described below.

Figure 19:
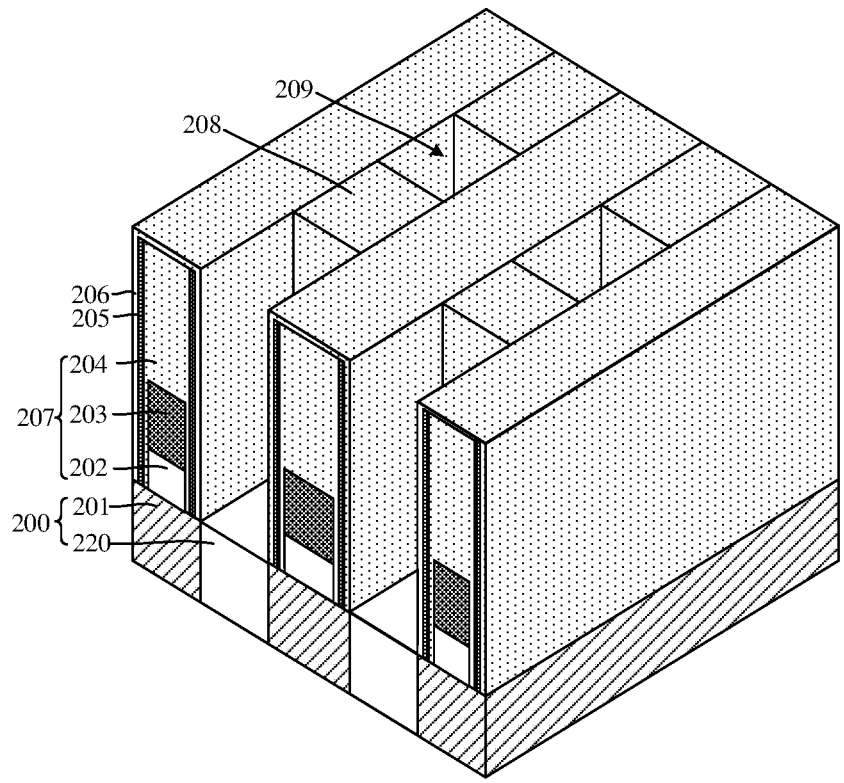
Figure 20:
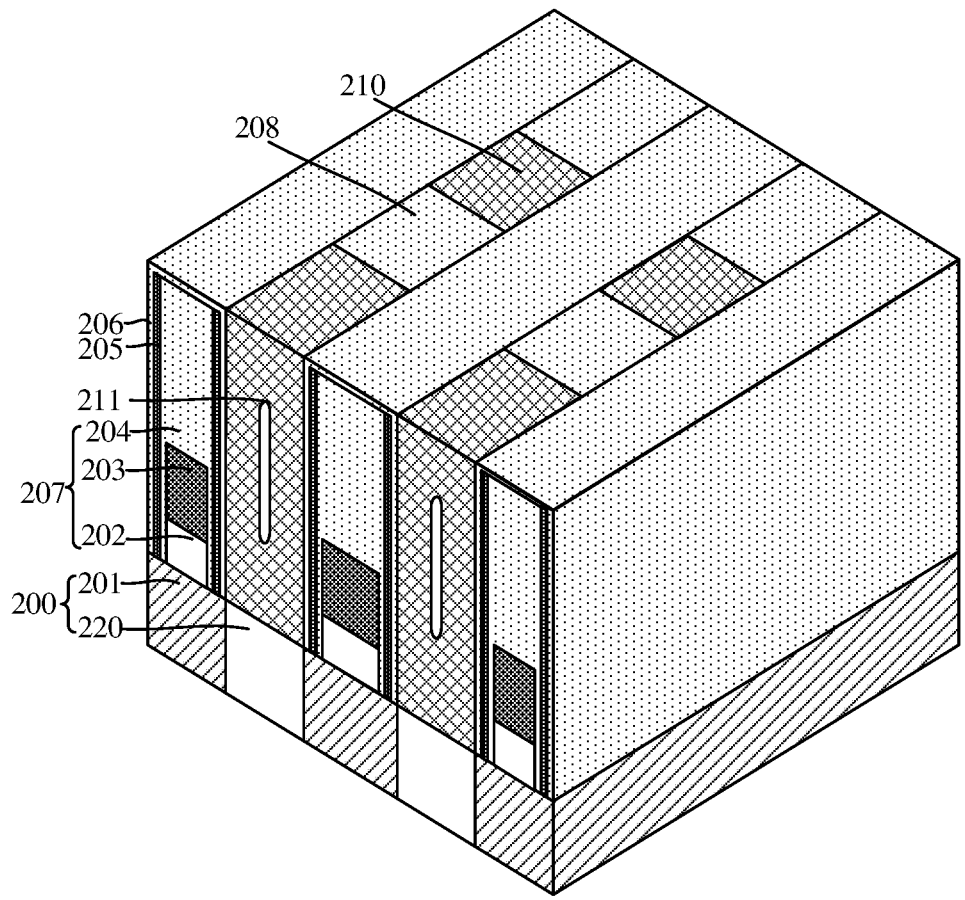

Referring to FIGS. 19 and 20, a dielectric layer 208 and a contact layer 210 that fill the trenches 214 (refer to FIG. 18) are formed, parts of the dielectric layer 208 and parts of the contact layer 210 being arranged at intervals in the first direction, both the dielectric layer 208 and the contact layer 210 being in contact with the substrate 200, and the contact layer 210 having first gaps 211.

Referring to FIG. 19, discrete parts of the dielectric layer 208 and through holes 209 between adjacent parts of the dielectric layer 208 are formed in the trenches 214.

The forming the dielectric layer 208 and the through holes 209 includes: first forming a sacrificial layer in the trenches 214; etching the sacrificial layer to form a filling groove; forming the dielectric layer 208 in the filling groove; and removing the remaining part of the sacrificial layer to form the through holes 209 between the adjacent parts of the dielectric layer 208.

In this embodiment, the dielectric layer 208 is of a single-layer structure, the material of the dielectric layer 208 has a relatively high density, and no second gaps are formed in the dielectric layer 208. Therefore, the dielectric layer 208 has a better isolation effect. In one example, the material of the dielectric layer 208 may be silicon nitride.

In other embodiments, silicon oxide with a relatively fast deposition rate may also be used as the material of the dielectric layer. In this case, second gaps may be formed in the dielectric layer. Alternatively, the dielectric layer may also be of a multi-layer structure, for example, the dielectric layer includes a first sub-dielectric layer and a second sub-dielectric layer, the material in the first sub-dielectric layer may be silicon nitride, the material of the second sub-dielectric layer may be silicon oxide, and second gaps may be formed in the second sub-dielectric layer. If there are second gaps in the dielectric layer, the dielectric layer may be etched later to expose the second gaps, and a filling layer is formed in the second gaps.

Referring to FIG. 20, a contact layer 210 filling the through holes 209 (refer to FIG. 19) is formed. In this embodiment, the contact layer 210 is formed by low-pressure chemical vapor deposition. In other embodiments, the contact layer may also be formed by atmospheric pressure chemical vapor deposition.

The material of the contact layer 210 may be polysilicon.

There are first gaps 211 in the contact layer 210. It is worth noting that, compared with the filling of the trenches in the first embodiment, the first gaps in the contact layer that are formed by filling the through holes have a relatively large volume in this embodiment.

Figure 21:
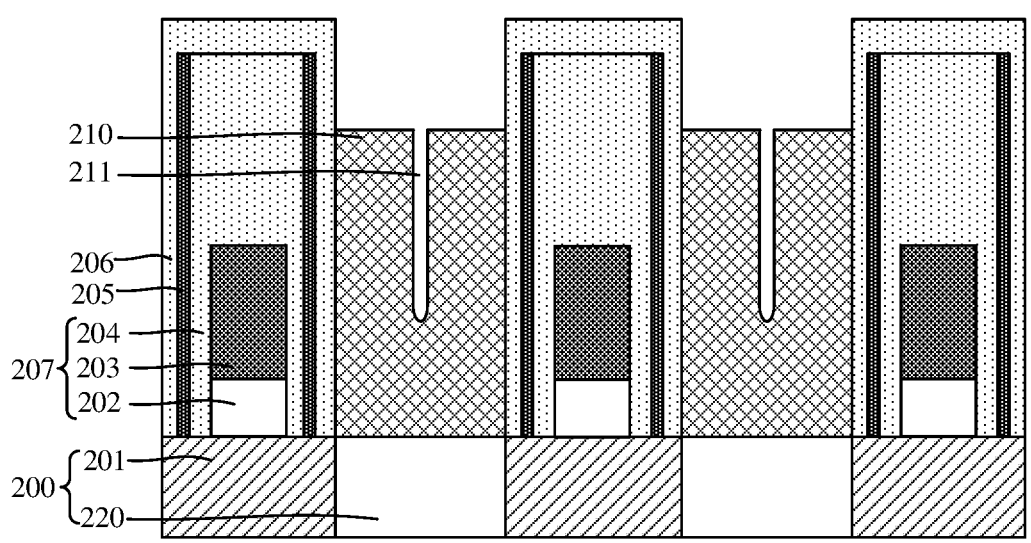

Referring to FIG. 21, part of the contact layer 210 is removed to expose the first gaps 211. In this embodiment, part of the contact layer 210 is removed by dry etching. In other embodiments, wet etching may also be used.

It is worth noting that, if there are second gaps in the dielectric layer, while the first gaps are exposed, part of the dielectric layer may also be removed to expose the second gaps.

Figure 22:
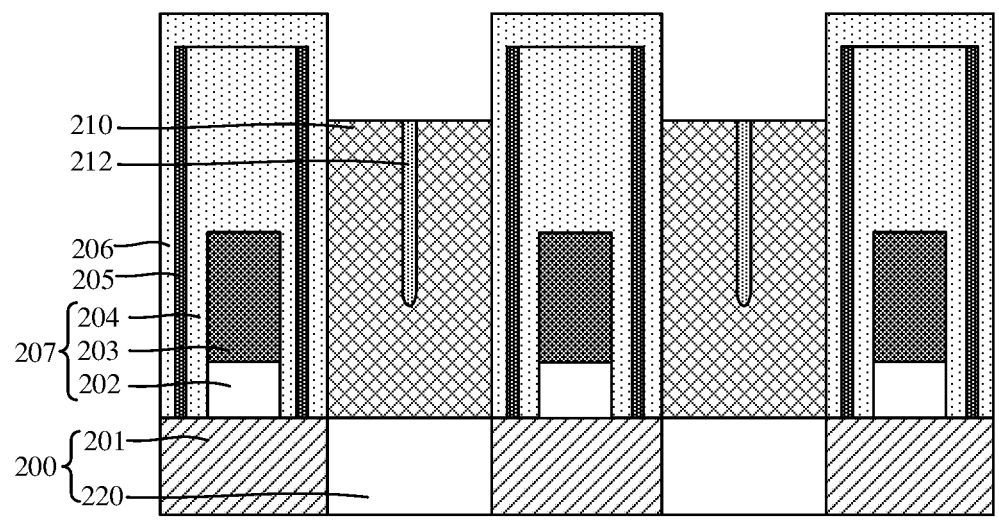

Referring to FIG. 22, a filling layer 212 is formed to fill the first gaps 211 (refer to FIG. 21). An initial filling layer is formed in the first gaps 211 and on the surface of the contact layer 210, and the initial filling layer on the surface of the contact layer 210 is removed, the initial filling layer in the first gaps 211 serving as the filling layer 212.

The filling layer 212 has a relatively high density, and its material may be silicon nitride. In another embodiment, the material of the filling layer 212 may also be silicon oxynitride.

It is worth noting that, in other embodiments, if there are second gaps in the dielectric layer, while the first gaps are filled, the second gaps may be filled, thereby improving the firmness of the dielectric layer and reducing the risk of conductive breakdown.

Figure 23:
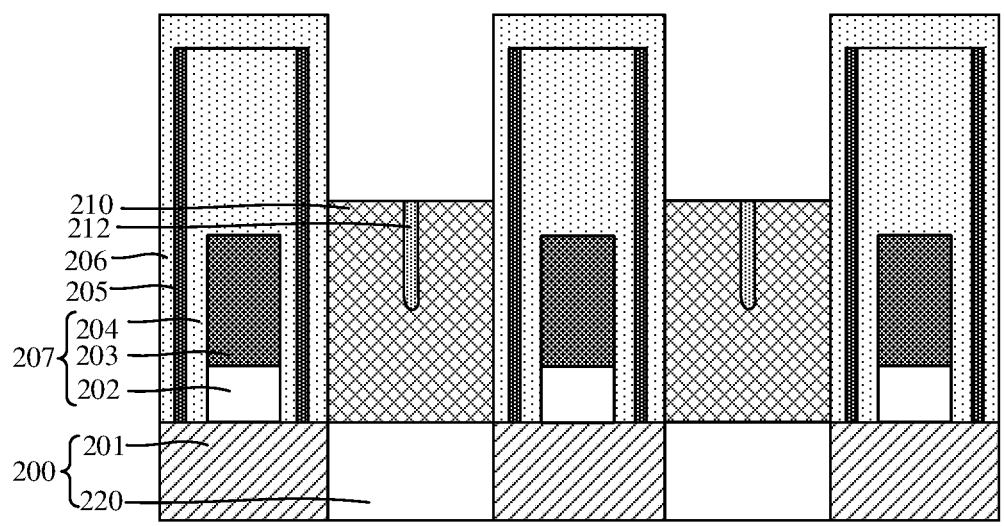

Referring to FIG. 23, the contact layer 210 and the filling layer 212 are etched back to reduce the heights of the contact layer 210 and the filling layer 212. In one embodiment, the top surfaces of the contact layer 210 and the filling layer 212 are flush with the top surface of the bit line conductive layer 203 by back etching. In another embodiment, the top surfaces of the contact layer 210 and the filling layer 212 are at positions of ⅓ to ⅔ of the height of the bit lines 207. It can be understood that, because the first gaps 211 are filled with the filling layer 212, the etching gas cannot enter the first gaps 211 to expand the first gaps 211 to cause voids in the contact layer 210. Therefore, the semiconductor structure has good electrical performance without the risk of electrical breakdown.

Figure 24:
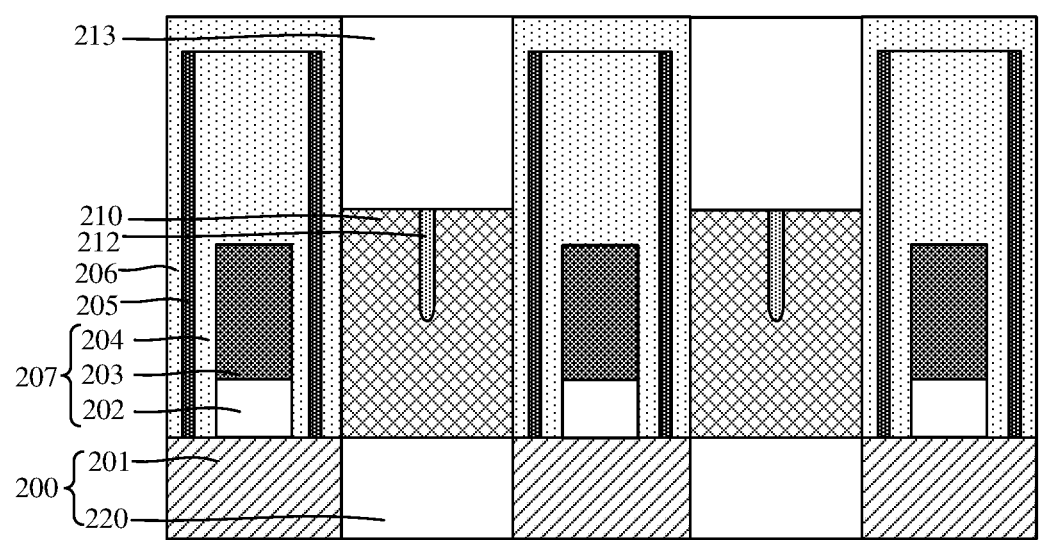

Referring to FIG. 24, a conductive layer 213 is formed on the remaining part of the contact layer 210 and the remaining part of the filling layer 212. The conductive layer 213 is used to electrically connect the capacitor formed later, so the material of the conductive layer 213 has relatively low resistance, for example, it may be a metal such as copper, aluminum, or tungsten. In this embodiment, the conductive layer 213 is formed by physical vapor deposition.

Based on the above, in this embodiment, the contact layer 210 is formed by filling the through holes 209 between the parts of the dielectric layer 208, the contact layer 210 has the first gaps 211, and the filling layer 212 filling the first gaps 211 is formed, which can avoid expansion of the first gaps 211 in the subsequent etching process, thereby improving the electrical performance of the semiconductor structure and avoiding the risk of conductive breakdown.

The third embodiment of the present disclosure provides a semiconductor structure. FIGS. 15 and 17 are schematic diagrams of the semiconductor structure provided in this embodiment. Referring to FIGS. 15 and 17, the semiconductor structure includes: a substrate 100, the substrate 100 having bit lines 107 extending in a first direction; a dielectric layer 118 and a contact layer 112 that are located between adjacent bit lines 107, parts of the dielectric layer 118 and parts of the contact layer 112 being arranged at intervals in the first direction, and both the dielectric layer 118 and the contact layer 112 being in contact with the substrate 100; and a filling layer 120 located in the contact layer 112, the contact layer 112 exposing the top surface of the filling layer 120.

Referring to FIG. 15, the substrate 100 includes active regions 102 and an isolation structure 101 for isolating adjacent active regions 102. The substrate 100 may further include buried word lines 104, a gate dielectric layer and a first insulating layer. Detailed description of the substrate 100 refers to the first embodiment, and details are not described herein again.

Referring to FIG. 17, the bit lines 107 include a bit line contact layer, a barrier layer 108, a bit line conductive layer 109 and a second insulating layer 110 that are stacked. The surfaces of the bit lines also have a protective layer 111 to protect the bit lines 107 from being oxidized. Detailed description of the bit lines refers to the first embodiment, and details are not described herein again.

There is a contact layer 112 between the adjacent bit lines 107. In this embodiment, the contact layer 112 is a capacitor contact layer for electrically connecting a capacitor and the substrate 100.

In this embodiment, the material of the contact layer 112 is polysilicon. In other embodiments, the material of the contact layer may also be a conductive material such as tungsten, aluminum, or copper.

There is a filling layer 120 in the contact layer 112, that is, the filling layer 120 fills the original first gaps in the contact layer 112, so the filling layer 120 can reduce the risk of conductive breakdown and improve the electrical performance of the contact layer 112.

The material of the filling layer 120 has a relatively high density to increase the filling rate, so as to further reduce the risk of conductive breakdown. In this embodiment, the material of the filling layer 120 is silicon nitride. In other embodiments, the material of the filling layer 120 may also be silicon oxynitride.

Continuing to refer to FIG. 15, the filling layer 120 is also located in the dielectric layer 118, and the dielectric layer 118 exposes the top surface of the filling layer 120. That is, the filling layer 120 also fills the original second gaps in the dielectric layer 118. Therefore, the filling layer 120 can further improve the firmness of the dielectric layer 118, thereby improving the isolation effect.

In this embodiment, the dielectric layer 118 includes a first sub-dielectric layer 116 and a second sub-dielectric layer 117; the first sub-dielectric layer 116 covers the surface of the substrate 100 and the side walls of the contact layer 112; the second sub-dielectric layer 117 is located on the surface of the first sub-dielectric layer 116; the material of the second sub-dielectric layer 117 is different from that of the first sub-dielectric layer 116, the filling layer 120 is also located in the second sub-dielectric layer 117, and the second sub-dielectric layer 117 exposes the top surface of the filling layer 120.

In this embodiment, the material of the first sub-dielectric layer 116 is silicon nitride. The silicon nitride has relatively high density and hardness, which can improve the firmness of the semiconductor structure. In other embodiments, the material of the first sub-dielectric layer may also be silicon oxynitride.

In this embodiment, the second sub-dielectric layer 117 has a relatively low dielectric constant, and the material of the second sub-dielectric layer 117 is silicon oxide. In other embodiments, the material of the second sub-dielectric layer may also be silicon carbide.

It can be understood that, in other embodiments, the dielectric layer may also be of a single-layer structure. When the dielectric layer is made of a material with relatively high density, there are no second gaps inside, and accordingly, the filling layer may not be used; when the dielectric layer is made of a material with a relatively fast deposition rate and a relatively low density, there may be second gaps inside, and accordingly, the filling layer may be used to fill the second gaps.

Based on the above, in the semiconductor structure provided in this embodiment, there is a filling layer 120 inside the contact layer 112, and the filling layer 120 fills the original first gaps, thereby improving the electrical performance of the contact layer 112, reducing the risk of conductive breakdown and improving the yield of the semiconductor structure.

The embodiments or implementations in this specification are described in a progressive manner, each embodiment focuses on the differences from other embodiments, and the same or similar parts between the various embodiments may be referred to each other.

In the description of this specification, the descriptions with reference to the terms "embodiment", "exemplary embodiment", "some implementations", "schematic implementation", "example", etc. mean that specific features, structures, materials or characteristics described in conjunction with the embodiments or examples are included in at least one embodiment or example of the present application.

In this specification, the schematic descriptions of the above terms do not necessarily refer to the same embodiment or example. Moreover, the described specific features, structures, materials or characteristics can be combined in an appropriate manner in any one or more embodiments or examples.

In the description of the present disclosure, it should be noted that the orientations or positional relationships indicated by the terms "center", "upper", "lower", "left", "right", "vertical", "horizontal", "inner", "outer", etc. are based on the orientations or positional relationships shown in the accompanying drawings, and are intended to facilitate the description of the present disclosure and simplify the description only, rather than indicating or implying that the device or element referred to must have a particular orientation or be constructed and operated in a particular orientation, and will not to be interpreted as limiting the present disclosure.

It can be understood that the terms "first", "second", etc. used in the present disclosure can be used in the present disclosure to describe various structures, but these structures are not limited by these terms. These terms are only used to distinguish the first structure from another structure.

In one or more drawings, the same elements are represented by similar reference numerals. For the sake of clarity, various parts in the drawings are not drawn to scale. In addition, some well-known parts may not be shown. For the sake of brevity, the structure obtained after several steps can be described in one figure. Many specific details of the present disclosure are described below, such as the structure, material, dimension, treatment process and technology of devices, in order to understand the present disclosure more clearly. However, as those skilled in the art can understand, the present disclosure may not be implemented according to these specific details.

Finally, it should be noted that the above embodiments are merely used to describe, but not to limit, the technical solutions of the present disclosure. Although the present disclosure is described in detail with reference to the above embodiments, those of ordinary skill in the art should understand that various modifications may be made to the technical solutions described in the foregoing embodiments, or equivalent substitutions may be made to some or all technical features thereof, and these modifications or substitutions do not make the essences of the corresponding technical solutions depart from the scope of the technical solutions of the embodiments of the present disclosure.

INDUSTRIAL APPLICABILITY

In the method for manufacturing a semiconductor structure provided by the present disclosure, the filling layer is formed in the first gaps of the contact layer, and the filling layer can prevent the etching gas from entering the first gaps, thereby avoiding expansion of the first gaps to cause voids in the contact layer, then improving the electrical performance of the contact layer, reducing the risk of conductive breakdown, and improving the yield of the semiconductor structure.

The invention claimed is:

1. A method for manufacturing a semiconductor structure, comprising:
providing a substrate, and forming bit lines extending in a first direction and trenches located between adjacent bit lines of the bit lines on the substrate;
forming a dielectric layer and a contact layer filling the trenches, parts of the dielectric layer and parts of the contact layer being arranged at intervals in the first direction, both the dielectric layer and the contact layer being in contact with the substrate, and the contact layer having first gaps;
removing a second part of the contact layer, to expose the first gaps;
forming a filling layer to fill the first gaps; and
etching the contact layer and the filling layer back.

2. The method for manufacturing a semiconductor structure of claim 1, wherein the forming a contact layer comprises: forming an initial contact layer filling the trenches; and patterning the initial contact layer, to form a plurality of discrete parts of the contact layer and spacer grooves between adjacent parts of the contact layer in the trenches.

3. The method for manufacturing a semiconductor structure of claim 2, wherein a method for forming the initial contact layer comprises: low-pressure chemical vapor deposition; wherein process parameters of the low-pressure chemical vapor deposition comprise: a temperature of 380° C. to 500° C. and an air pressure of 1 Torr to 3 Torr.

4. The method for manufacturing a semiconductor structure of claim 2, wherein the patterning the initial contact layer comprises: forming a mask layer extending in a second direction on the initial contact layer; and performing dry etching on the initial contact layer by using the mask layer as a mask, to form the spacer grooves, until bottoms of the spacer grooves expose the substrate, wherein the second direction is different from the first direction.

5. The method for manufacturing a semiconductor structure of claim 4, wherein an angle between the second direction and the first direction is 75° to 90°.

6. The method for manufacturing a semiconductor structure of claim 2, wherein the forming a dielectric layer comprises: forming the dielectric layer to fill the spacer grooves, the dielectric layer having second gaps.

7. The method for manufacturing a semiconductor structure of claim 6, further comprising: while removing the second part of the contact layer, to expose the first gaps, removing a second part of the dielectric layer, to expose the second gaps.

8. The method for manufacturing a semiconductor structure of claim 6, wherein while the filling layer is formed to fill the first gaps, the filling layer also fills the second gaps.

9. The method for manufacturing a semiconductor structure of claim 6, wherein the forming a dielectric layer comprises: forming a first sub-dielectric layer, the first sub-dielectric layer covering bottoms and side walls of the spacer grooves; and forming a second sub-dielectric layer, the second sub-dielectric layer being located on a surface of the first sub-dielectric layer and filling the spacer grooves, material of the second sub-dielectric layer being different from material of the first sub-dielectric layer, and the second sub-dielectric layer having the second gaps.

10. The method for manufacturing a semiconductor structure of claim 9, wherein in the first direction, a ratio of thickness of the first sub-dielectric layer to width of the spacer grooves is 1:4 to 1:3.

11. The method for manufacturing a semiconductor structure of claim 10, wherein a ratio of thickness of the second sub-dielectric layer to the thickness of the first sub-dielectric layer is 3:1 to 2:1.

12. The method for manufacturing a semiconductor structure of claim 9, wherein before the second part of the contact layer is removed, the first sub-dielectric layer and the second sub-dielectric layer on a top surface of the contact layer are also removed.

13. The method for manufacturing a semiconductor structure of claim 1, after etching the contact layer and the filling layer back, further comprising: forming a conductive layer on a remaining part of the contact layer and a remaining part of the filling layer.

14. A semiconductor structure, comprising:
a substrate, the substrate having bit lines extending in a first direction;
a dielectric layer and a contact layer located between adjacent bit lines of the bit lines, parts of the dielectric layer and parts of the contact layer being arranged at intervals in the first direction, and both the dielectric layer and the contact layer being in contact with the substrate; and
a filling layer located in the contact layer, and the contact layer exposing a top surface of the filling layer;
wherein the semiconductor structure is manufactured by a method comprising:
providing the substrate, and forming the bit lines extending in the first direction and trenches located between the adjacent bit lines on the substrate;
forming the dielectric layer and the contact layer filling the trenches, the parts of the dielectric layer and the parts of the contact layer being arranged at the intervals in the first direction, both the dielectric layer and the contact layer being in contact with the substrate, and the contact layer having first gaps;

removing a second part of the contact layer, to expose the first gaps;

forming the filling layer to fill the first gaps; and etching the contact layer and the filling layer back.

15. The semiconductor structure of claim 14, wherein the filling layer is also located in the dielectric layer, and the dielectric layer exposes the top surface of the filling layer.

16. The semiconductor structure of claim 15, wherein the dielectric layer comprises a first sub-dielectric layer and a second sub-dielectric layer;

the first sub-dielectric layer covers a surface of the substrate and side walls of the contact layer;

the second sub-dielectric layer is located on a surface of the first sub-dielectric layer; material of the second sub-dielectric layer is different from material of the first sub-dielectric layer, the filling layer is also located in the second sub-dielectric layer, and the second sub-dielectric layer exposes the top surface of the filling layer.

17. The semiconductor structure of claim 16, wherein the material of the first sub-dielectric layer comprises silicon nitride; the material of the second sub-dielectric layer comprises silicon oxide; and material of the filling layer comprises silicon nitride.

18. The semiconductor structure of claim 14, wherein the contact layer is a capacitor contact layer.

19. The semiconductor structure of claim 14, wherein material of the contact layer comprises polysilicon.

* * * * *